US010548233B2

(12) United States Patent
Briquet (10) Patent No.: US 10,548,233 B2
(45) Date of Patent: Jan. 28, 2020

(54) PRINTED CIRCUIT PROTECTIVE CASE BASE PLATE PROVIDED WITH A RIVET BLANK BORNE BY A VENTILATION FILTER

(71) Applicants: CONTINENTAL AUTOMOTIVE FRANCE, Toulouse (FR); CONTINENTAL AUTOMOTIVE GmbH, Hannover (DE)

(72) Inventor: Capucine Briquet, Toulouse (FR)

(*) Notice: Subject to any disclaimer, the term of this patent is extended or adjusted under 35 U.S.C. 154(b) by 0 days.

(21) Appl. No.: 15/434,255

(22) Filed: Feb. 16, 2017

(65) Prior Publication Data

US 2017/0245381 A1  Aug. 24, 2017

(30) Foreign Application Priority Data

Feb. 19, 2016  (FR) ...................... 16 51396

(51) Int. Cl.
| H05K 7/20 | (2006.01) |
| H05K 5/02 | (2006.01) |
| H05K 5/00 | (2006.01) |
| H05K 7/14 | (2006.01) |

(52) U.S. Cl.
CPC ........... *H05K 5/0213* (2013.01); *H05K 5/006* (2013.01); *H05K 7/1417* (2013.01); *H05K 7/1427* (2013.01); *H05K 7/20009* (2013.01)

(58) Field of Classification Search
None
See application file for complete search history.

(56) References Cited

U.S. PATENT DOCUMENTS

| 4,646,864 | A | * | 3/1987 | Racchi | ................... | B60K 11/08 |
| | | | | | | 180/69.22 |
| 5,334,799 | A | * | 8/1994 | Naito | ................. | H01M 2/1022 |
| | | | | | | 174/17 VA |
| 6,502,295 | B1 | | 1/2003 | Morgand | | |
| 9,340,168 | B2 | * | 5/2016 | Shinoda | .............. | H05K 5/0047 |

(Continued)

FOREIGN PATENT DOCUMENTS

| CN | 101375650 | 2/2009 |
| CN | 202150862 | 2/2012 |

(Continued)

OTHER PUBLICATIONS

Design Guide Line 103 11111 SPE 000 AB (Continental).
FR Search Report, dated Nov. 10, 2016, from corresponding FR application.

*Primary Examiner* — Courtney L Smith
(74) *Attorney, Agent, or Firm* — Young & Thompson (57) ABSTRACT

Disclosed is a base plate (1) and the protective case of a printed circuit. The plate includes a ventilation filter (4) and at least one rivet blank (5) projecting from the plate and intended to penetrate the printed circuit and to be deformed for rigidly connecting the printed circuit to the base plate by projecting from a face (1a) of the plate, the filter including at least one ventilation opening (6). The rivet blank is borne by the filter and includes an internal tube (7) passing right through the rivet blank in the projecting direction thereof, the internal tube opening, on one side, onto an end of the rivet blank that projects furthest from the plate while forming the ventilation opening and, on the other side, into the ventilation filter.

20 Claims, 4 Drawing Sheets

(56) References Cited

U.S. PATENT DOCUMENTS

| | | | | |
|---|---|---|---|---|
| 2008/0074840 A1* | 3/2008 | Suzuki | ............... | H05K 5/0047 |
| | | | | 361/679.46 |
| 2009/0103267 A1* | 4/2009 | Wieland | ............ | H05K 7/20409 |
| | | | | 361/707 |
| 2009/0127159 A1* | 5/2009 | Wang | ............... | H01L 21/67353 |
| | | | | 206/701 |
| 2009/0180265 A1* | 7/2009 | Chlumsky | .............. | H05K 5/006 |
| | | | | 361/759 |
| 2010/0155035 A1* | 6/2010 | Ishida | ...................... | G06F 1/20 |
| | | | | 165/80.4 |
| 2011/0170260 A1* | 7/2011 | Sarginger | ............ | B60R 16/0239 |
| | | | | 361/690 |
| 2012/0013741 A1* | 1/2012 | Blake, III | ............... | B60R 11/00 |
| | | | | 348/148 |
| 2015/0305172 A1 | 10/2015 | Guameros Jones et al. | | |
| 2015/0334863 A1* | 11/2015 | Beer | .................. | H05K 5/0213 |
| | | | | 220/745 |

FOREIGN PATENT DOCUMENTS

| | | |
|---|---|---|
| CN | 203761727 | 8/2014 |
| CN | 105144858 | 12/2015 |
| CN | 105163542 | 12/2015 |
| DE | 10 2012 112098 A1 | 6/2014 |
| EP | 1 108 481 A2 | 6/2001 |
| EP | 1 799 021 A2 | 6/2007 |
| EP | 2 514 537 A1 | 10/2012 |
| WO | 2014/095171 A1 | 6/2014 |

\* cited by examiner

PRINTED CIRCUIT PROTECTIVE CASE BASE PLATE PROVIDED WITH A RIVET BLANK BORNE BY A VENTILATION FILTER

FIELD OF THE INVENTION

The present invention relates to a base plate for a protective case of a printed circuit with a rivet blank borne by a ventilation filter and an assembly of a protective case and of a printed circuit provided with such a base plate. Such a protective case can be housed in the computer, particularly but not solely in a computer on board a motor vehicle.

BACKGROUND OF THE INVENTION

In a known manner, the base plate includes a ventilation filter and at least one rivet blank projecting from the plate. Said at least one rivet blank is intended to penetrate the printed circuit and to be deformed for rigidly connecting the printed circuit to the base plate. Said at least one rivet blank projects from a face of the plate. The ventilation filter includes a ventilation opening.

The ventilation filter function, also called a breather, borne by a base plate of a case housing a printed circuit is provided by a specific shape produced on the base plate. A so-called breathable membrane is stuck on a shape stamped into the base plate of the case, then covered by a protective member, advantageously a label with the four corners thereof bored through.

The base plates of an electronic case are generally produced by stamping. These base plates have one or more rivet blanks that are precursors of a respective rivet intended to fix, by riveting, a printed circuit to the base plate. The printed circuit is frequently in the form of an electronic board.

The rivet blanks and then the formed rivets can, for example, be placed on the perimeter of the base plate while being evenly distributed in order to provide the isostatism of the assembly formed from the printed circuit and the base plate, the printed circuit being linked to an electrical connector by being incorporated in a protective case comprising such a base plate.

One of the difficulties of forming a base plate of such a case is the production of rivet blanks, then the riveting operation. The formation of the rivet blanks by stamping, then of the rivets by deformation of the blanks should be carried out progressively in successive steps. This requires various levels of depth about each rivet blank.

It is normally preferred to place the rivet blanks on a base plate in areas covered with a thermal material and known as a thermal platform or in stamping areas. Thus, the material of the rivet blanks is less stressed and the risks of having cracks is reduced. As a result, it is relatively rare to have a rivet in the middle of the base plate of the case in a flat area.

Another difficulty associated with riveting is the pressing of the rivet blank in order to deform it when assembling the printed circuit on the base plate, which is frequently made of aluminum. The initial shape of the rivet blank is decisive as is the pressure force and the shape of the tools which press on the rivet blank in order to deform it.

The faults occurring during this riveting process can be cracks or an excessive material thickness reduction. It is important to eliminate these faults in order to ensure sealing of the case and, consequently, of the computer as an assembly comprising the case and the circuit incorporated in the case.

During the design of a printed circuit, particularly in the form of an electronic board, it is necessary to take into account the future locations of the rivets and the geometry associated with the ventilation filter function. Indeed, in these areas there must not be electronic components which collide either with the base plate or with the equipment used for assembling, for example the tools for deformation by pressing the rivet blanks in order to form the rivets.

These areas are therefore restrictive with regard to the placement of the components and of the electronic tracks on the printed circuit. Therefore, it is sometimes complicated to develop a printed circuit configuration that is compatible with the size of the case which must be as small as possible as is frequently required.

The problem underlying the present invention is, for an assembly of a protective case and printed circuit housed in the case comprising a base plate, this base plate comprising a ventilation filter and at least one rivet blank for holding the printed circuit with respect to the base plate, to position the rivet blank on an area of the base plate, firstly, corresponding during the riveting operation to an area of the printed circuit which is free of any electronic component and, secondly, which is suitable for implementing a riveting method that does not cause cracks on the rivet formed in this manner.

SUMMARY OF THE INVENTION

To this end, the present invention relates to a base plate for a protective case of a printed circuit, the plate including a ventilation filter and at least one rivet blank projecting from the plate in one direction, said at least one rivet blank being intended to penetrate the printed circuit and to be deformed for rigidly connecting the printed circuit to the base plate by projecting from a face of the plate, the ventilation filter including a ventilation opening, characterized in that said at least one rivet blank is borne by the ventilation filter and includes an internal tube passing right through said at least one rivet blank in the projecting direction thereof, the internal tube opening, on one side, onto an end of said at least one rivet blank projecting furthest from the plate while forming the ventilation opening and, on the other side, into the ventilation filter.

The technical effect, due to the positioning on the ventilation filter of at least one rivet blank, and consequently of the rivet once it has been formed, is to give the rivets formed in this manner two functions, namely a function for rigid connection by riveting of the printed circuit to the base plate and a ventilation function. This is combined with a gain in space on the base plate and on the printed circuit. An additional technical effect relates to the ease of forming the rivet borne by the ventilation filter.

It is known that the printed circuit portion placed in alignment in the case with the ventilation filter does not comprise any electronic component and it is also known, that in the alignment of a rivet, the printed circuit also does not comprise any electronic component. Positioning at least one rivet blank on the ventilation filter therefore allows an alignment of the rivet blank with a portion of the printed circuit that already contains no electronic component since it is aligned with the ventilation filter. Therefore, there is a gain in space on the printed circuit by aligning a same portion containing no electronic component with two elements of the base plate requiring this, namely a rivet blank and a ventilation filter.

For example, it is known to place the rivets in an area locally covered with a thermal interface material, this area being called a thermal platform. The printed circuit portions aligned with the thermal platform area of the base plate are free of electronic components. It is then possible to no longer use or to use to a lesser extent the thermal platform area for the positioning of one or more rivets.

The restrictions of placing the electronic components of a circuit frequently incorporated in the form of an electronic board are thus minimized and a new installation for a rivet blank on the base plate is offered, by placing it on the ventilation filter. This increases the flexibility for adjusting the base plate to various types of incorporated circuit.

Moreover, the ventilation filter is an area that is relatively planar and advantageously central to the base plate, which is suitable for the positioning of one or more rivets in this area. This then allows the production of the stamped shape of the rivet via successive steps, due to the specific shape that the ventilation filter can assume. Indeed, the formation of the rivet by stamping is difficult to carry out, particularly on the edges of the base plate which can then deform.

Advantageously, the internal tube opens into a ventilation device internal to a pedestal of the ventilation filter, the ventilation device comprising air flow channels.

Advantageously, the pedestal and said at least one rivet blank have been formed as a single piece with the base plate, the pedestal being rectangular and bearing at the middle thereof a central member which is part of the ventilation device, the air flow channels starting from the central member while being directed towards a respective portion of the contour of the pedestal, the pedestal being elevated with respect to the rest of the base plate on the face of the plate through which said at least one rivet blank projects, the central member and the air flow channels being elevated with respect to the pedestal on the same face of the plate, the air flow channels and the central member defining a recessed shape in the pedestal on the face of the plate opposite the face through which said at least one rivet blank projects. The ventilation filter therefore has a planar shape that is ideally suited to the installation of a rivet blank on the filter.

Advantageously, the base plate has at least two rivet blanks, the rivet blank or blanks other than said at least one rivet blank borne by the ventilation filter being either borne by the ventilation filter, or positioned on the base plate outside the ventilation filter, or some of them being borne by the ventilation filter, the rest of the rivet blanks being positioned on the base plate outside the ventilation filter.

If it is possible to have a printed circuit held on a base plate with a single rivet, the use of a base plate previously provided with several rivet blanks will allow a better distribution of the holding force on the printed circuit.

Advantageously, said at least one rivet blank has a cylindrical or conical base extended by a lug which ends by forming a free end of said at least one rivet blank.

The invention relates to a method of forming at least one rivet blank borne by a ventilation filter on a base plate as previously described, characterized in that the base and the lug of said at least one rivet blank are formed by at least two successive and respective stamping operations.

As mentioned above, the formation of the rivet by stamping is difficult to carry out. When the aim is to carry out the stamping operation in a single step, the material is too stressed and there can be cracks about the rivet or a lack of thickness. Having a relatively wide base extended by a narrower lug allows the stresses exerted on the material of the rivet blank to be reduced.

Advantageously, the ventilation filter is formed on the base plate by at least three successive stamping operations: a first stamping operation for the simultaneous formation of the central member and of the air flow channels followed by a second and a third stamping operation for the respective formation of the base and then of the lug of said at least one rivet blank.

The invention relates to a method of riveting a printed circuit on a base plate using at least one rivet blank borne by a ventilation filter, said at least one rivet blank being obtained in accordance with such a formation method, in which the free end of the lug of said at least one rivet blank is flattened and widened, transforming it into a rivet by pressure exerted from the outside towards the base plate on the free end of the lug against an anvil tool inserted via the internal tube into the lug starting from the base thereof, characterized in that the free end of the lug is bored through prior to or at the same time as the crushing and in that, after riveting, a membrane covering said at least one rivet is positioned on the face opposite the face of the base plate from where said at least one rivet projects.

Thus, after riveting, the rivet has a boring in the center for the passage of air and to allow it to carry out a ventilation function in addition to the riveting function thereof. The manufacture of the rivet no longer needs to be sealed, which is the case for a rivet of the prior art and which posed problems for maintaining the seal. The riveting is therefore carried out under less severe conditions than for a rivet placed elsewhere other than in a ventilation filter.

The invention relates to an assembly of a printed circuit and of the protective case thereof, the protective case comprising a hollow housing and a base plate, the hollow housing receiving the printed circuit in the interior thereof, the printed circuit being rigidly connected to the base plate of the case by at least one rivet, a wall of the protective case having a cutout receiving a connector electrically linked to the printed circuit, characterized in that the base plate of the assembly is as described above, said at least one rivet blank borne by the ventilation filter having been transformed into at least one rivet, a membrane covering said at least one rivet on the plate face opposite the face from where said at least one rivet projects and in that the printed circuit, in the form of a board bearing electronic components on a first face, has a second face opposite the first face applied against or held at a small distance from the base plate with said at least one rivet borne by the ventilation filter penetrating the printed circuit via a portion of the board free of any electronic component on the first face thereof.

The advantage of such a case is that it allows for the reduction of the restriction areas on the electronic circuit, advantageously in the form of a board, for the placement of the electronic components by combining two areas which should not contain electronic components into a single area, this area being the ventilation filter and particularly the pedestal thereof.

Another advantage of the present case is that, since the rivet passes through the printed circuit while having a bored-through free end forming the ventilation opening of the ventilation filter while being borne by the internal tube opening onto the second face of the printed circuit, the ventilation occurs directly on the face of the printed circuit including the electronic components instead of occurring on the first face of the printed circuit opposite the base plate. This allows a more effective ventilation.

Advantageously, a portion of the base plate is covered locally with a thermal interface material inserted between the base plate and the contour of the printed circuit second face applied against or held at a small distance from the base plate, and when at least one rivet is positioned on the base plate outside the ventilation filter, this rivet is located on a respective area of the portion of the base plate covered locally with the thermal interface material.

Advantageously, the ventilation filter comprises a protective member covering, on a face of the plate opposite that through which said at least one rivet projects, entirely the pedestal of the filter, the membrane and the rivet.

The membrane, in the form of a breathable membrane since it allows the passage of air, is stuck to the center of the ventilation filter about the rivet. Since the rivet has been bored through, the ventilation filter therefore perfectly fills the role thereof and the ventilation function thereof is, therefore, not lessened by the presence of at least one rivet borne by the filter.

BRIEF DESCRIPTION OF THE INVENTION

Other features, aims and advantages of the present invention will emerge upon reading the following detailed description with reference to the appended drawings given as nonlimiting examples and wherein.

DETAILED DESCRIPTION OF THE INVENTION

The figures are given as examples and do not limit the invention. They make up schematic representations of principle which are intended to facilitate the understanding of the invention and are not necessarily to the scale of the practical applications. In particular, the dimensions of the various elements illustrated cannot represent reality.

In the following description, reference is made to all of the figures taken in combination. When reference is made to one or more specific figures, these figures are to be taken in combination with the other figures in order to identify the designated numerical references.

Figure 1:
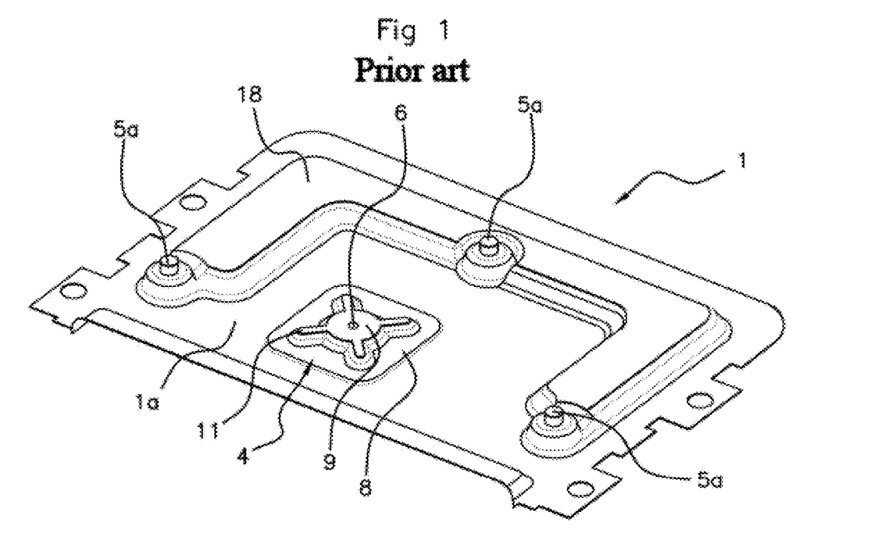
FIGS. 1 and 2 are schematic representations of respective views of opposite faces of a base plate intended for a protective case for a printed circuit, the face of the base plate of FIG. 1 being intended to be opposite the printed circuit while the face of FIG. 2 is intended to form a portion of the outer contour of the case, the base plate shown in these figures being in accordance with the prior art.
Figure 2:
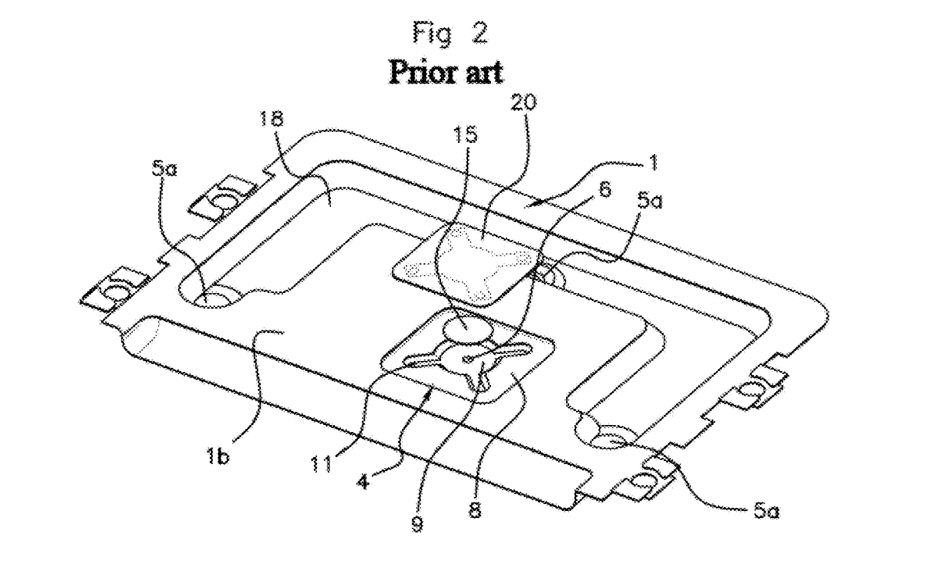
Figure 7:
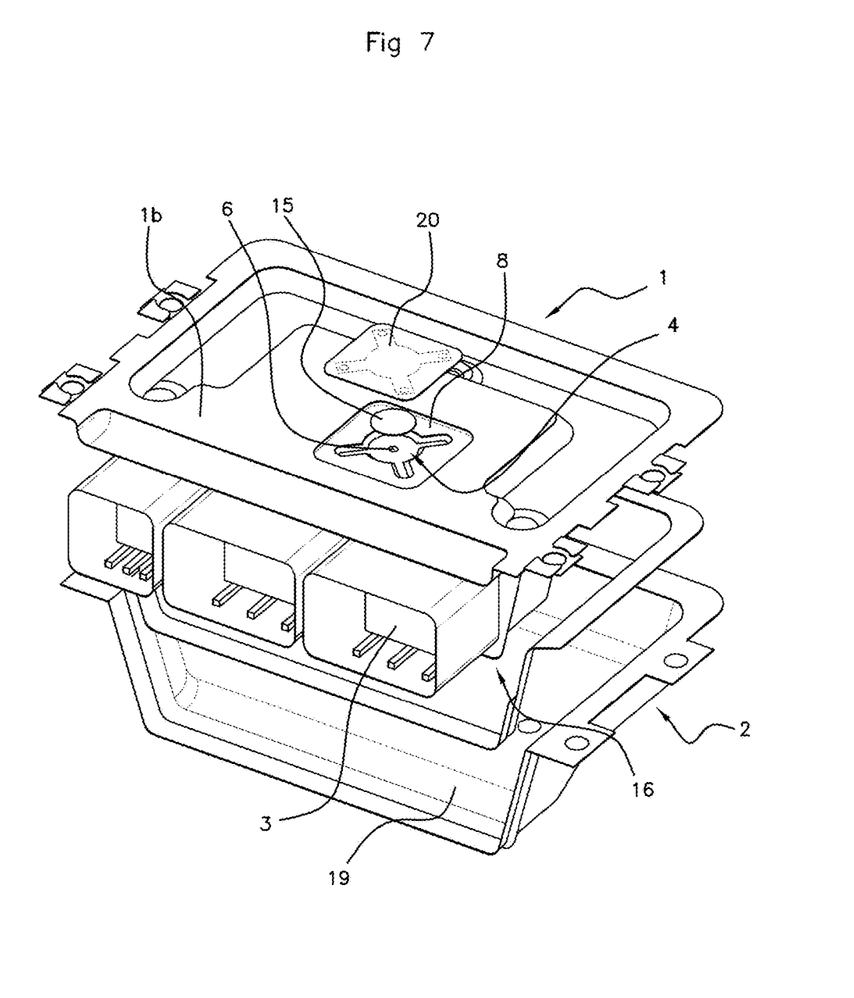
FIG. 7 is a schematic representation of a perspective view of a protective case incorporating a printed circuit in the form of an electronic board, the printed circuit being riveted to the base plate, this protective case being in accordance with the present invention when the base plate has a ventilation filter bearing a rivet obtained from a rivet blank shown in FIGS. 3 and 4.

Referring to all of the figures and particularly to FIGS. 1, 2 and 7, one aspect of the invention relates to a base plate 1 for a protective case 2 of a printed circuit 3, the case 2 and the printed circuit 3 being shown in FIG. 7. This base plate 1 can be removed from the protective case 2, in which instance the base plate 1 has elements for rigid connection with the rest of the case 2 or is an integral part of the protective case 2 or of part of the protective case 2.

The latter possibility is not preferred since it is more difficult then to mount the printed circuit 3 against the base plate 1. In the instance of a removable base plate 1, the elements for rigid connection of the base plate 1 and of the case 2 can be latching elements for rapid dismounting of the base plate 1 from the case 2.

Referring more particularly to FIGS. 1 and 2, a base plate 1 according to the prior art is shown. However, the features which will now be described are taken up for a base plate 1 in accordance with the present invention. The base plate 1 shown in these two figures is intended to be riveted to a printed circuit 3 but is shown in the configuration thereof prior to the riveting, only comprising rivet blanks 5a intended to be deformed to become rivets.

The rivet blank or blanks 5a project from a face 1a of the plate 1 shown in FIG. 1 that is intended to be opposite the printed circuit 3, in a projecting direction which can be perpendicular to the base plate 1. Each rivet blank 5a corresponds to a rivet not yet deformed and therefore in an initial state of the rivet prior to deformation. Each rivet blank 5a is visible on a base plate 1 that is not yet rigidly connected to the printed circuit, as shown in FIG. 1.

The base plate 1, shown in FIGS. 1 and 2, includes a ventilation filter 4 and three rivet blanks 5a projecting from the plate 1. The base plate 1 can, however, only include a single rivet blank 5a and two or more than three blanks 5a in other embodiments.

In FIGS. 1 and 2, the three rivet blanks 5a are arranged on a U-shaped elevated portion 18 of the base plate 1, in the middle of the portion 18 and at each end of the U-shaped portion 18, respectively. This elevated portion is intended to face a printed circuit 3 and is called a thermal platform 18 being covered with a thermal interface material inserted between the plate 1 and the printed circuit 3.

Figure 3:
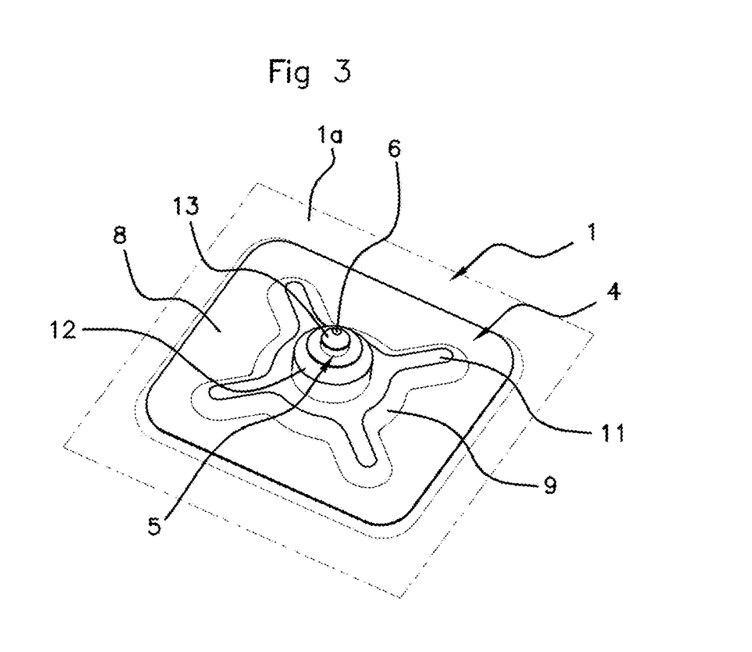
FIGS. 3 and 4 are schematic representations of respective top and bottom views of a portion of the base plate including a ventilation filter, a rivet blank being incorporated into the ventilation filter, the base plate including such a filter being in accordance with the present invention.
Figure 4:
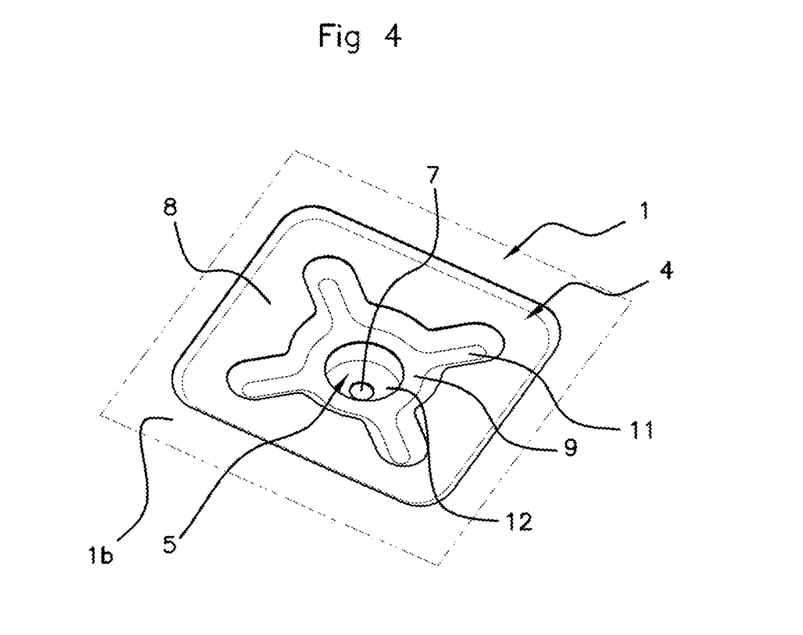

The rivet blanks 5a shown in FIGS. 1 and 2 will, hereafter, be referred to as outer blanks since they are different to a rivet blank 5 incorporated in a ventilation filter 4 as proposed by the invention, such a blank 5 being particularly shown in FIGS. 3 and 4.

The ventilation filter 4 of the base plate 1 includes at least one ventilation opening 6. If, in an embodiment, the ventilation filter 4 can contain several ventilation openings 6, in practice it is preferred to have a single ventilation opening 6 which is located in the center of a pedestal 8 of the ventilation filter 4. According to the invention, this ventilation opening 6 will be borne by a rivet blank passing through the ventilation filter at the end thereof projecting furthest from the base plate 1 as will be described in detail later.

The ventilation filter 4 also includes at least one air flow device 9, 11 connecting with the ventilation opening 6, this device comprising air flow channels 11, one of which is referenced in FIGS. 1 and 2. In a preferred embodiment, there are four air flow channels 11 which meet at the ventilation opening 6. The aim thereof is to direct the air from the inside of the computer, passing via the opening 6 then via the air flow device 9, 11 towards the outside of the computer in the prior art, which will no longer be the case in the present invention, the ventilation opening 6 being borne by the rivet blank at the end thereof which is furthest from the ventilation filter 4, as will be described later.

The ventilation filter 4 is used for the ventilation of the inside of the protective case 2, particularly for the evacuation of the heat given off by the printed circuit 3 during the operation thereof. In FIGS. 1 and 2, a single ventilation opening 6 which is central to the ventilation filter 4 is shown.

As can be seen in FIG. 2, a membrane 15 is intended to cover the central member 9. Then, a protective member 20, advantageously in the form of a label, covers the ventilation filter 4 and the membrane 15 on the face 1b of the base plate 1 opposite the face 1a from which the rivet blank or blanks 5a project. The membrane 15 and the protective member 20 are shown spaced from the base plate 1 in FIG. 2. This protective member 20 or label is certified to resist a high-pressure water jet. The high-pressure water jet test is standardized.

Figure 5:
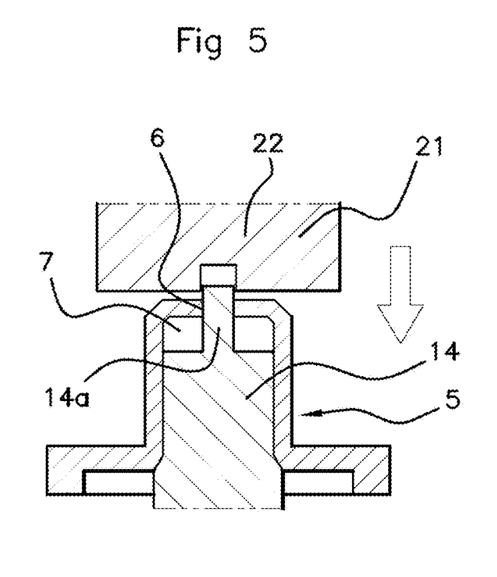
FIGS. 5 and 6 are schematic representations of a respective section view of two alternative embodiments of a method for riveting a rivet blank borne by a ventilation filter on a printed circuit, the free end of the rivet blank being bored through in these two embodiments in accordance with the present invention.
Figure 6:
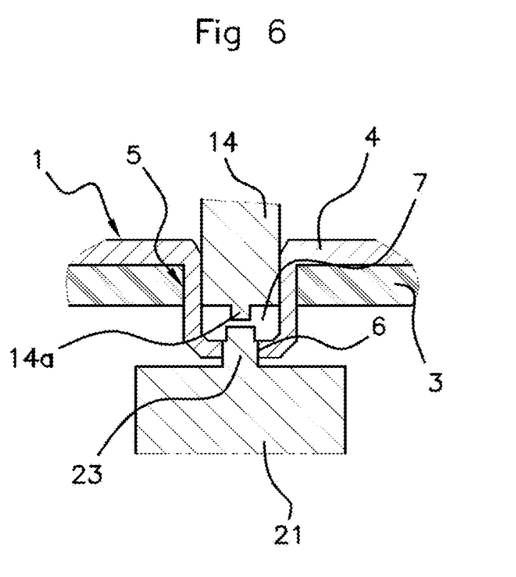

Referring more particularly to FIGS. 3 and 4, showing a ventilation filter 4 in accordance with the present invention, but also to FIGS. 5 and 6 for a better view of the internal tube 7 inside a rivet blank 5 borne by the ventilation filter 4, according to the present invention, at least one rivet blank 5 is borne by the ventilation filter 4.

The rivet blank 5 borne by the ventilation filter 4 includes an internal tube passing right through it in the projecting direction thereof from the base plate 1. The internal tube 7 opens, on one side, onto an end of the rivet blank 5 that projects furthest from the plate 1 while forming the ventilation opening 6 and, on the other side, into the ventilation filter 4. The internal tube 7 therefore extends over the entire length of the rivet blank 5 borne by the ventilation filter 4, the length of the rivet blank 5 being taken in the projecting direction, this projecting direction being advantageously perpendicular to the plane of the base plate 1.

Such an internal tube 7 is intended to link the inside of the case containing the printed circuit 3 to the ventilation filter 4 via the ventilation opening 6. It contributes to fully providing the ventilation function that the ventilation filter 4 must carry out, which gives a rivet blank 5 borne by the ventilation filter 4 a second function in addition to the riveting function once deformed.

The preferred configuration of the present invention is a ventilation filter 4 with an air flow device 9, 11 and a rivet blank 5 starting from a central portion of the ventilation filter 4 in order to project from the base plate 1 with an internal tube 7 extending in the projecting direction, substantially perpendicular to this base plate 1 and ending at the free end thereof furthest from the base plate 1 with the ventilation opening 6.

However, it is possible within the scope of the present invention to have a rivet blank 5 borne by the ventilation filter 4 that is moved off center with respect to the mid-portion of the ventilation filter 4, this rivet blank 5 having, over the length thereof, an internal tube 7 therethrough which opens out at the base plate 1 onto the ventilation device 9, 11 of the ventilation filter 4.

The presence of a rivet blank 5 borne by the ventilation filter 4 does not, however, exclude the presence of rivet blanks 5a borne by the base plate 1 outside the ventilation filter 4 as shown in FIGS. 1 and 2 but allows the removal of at least one of these rivet blanks 5a said to be outside the ventilation filter 4.

Several configurations are possible while being covered by the present invention. In all of the configurations covered by the invention, there is always at least one rivet blank 5 borne by the ventilation filter 4 including an internal tube 7 ending at one end with a ventilation opening 6 and connecting with the ventilation filter 4 at the other end thereof.

For example, the base plate 1 can include a single rivet blank 5, in which instance the rivet blank 5 is borne by the ventilation filter 4, without another outer rivet blank 5a located on the base plate 1.

Another configuration provides a base plate 1 provided with several rivet blanks 5, 5a, at least one of which is borne by the ventilation filter 4. In this configuration, there can be several rivet blanks 5 borne by the ventilation filter 4, which are optionally associated with one or more outer rivet blanks 5a located on the base plate 1 outside the ventilation filter 4.

Some of the rivet blanks 5, 5a can therefore be borne by the ventilation filter 4, wherein this can advantageously be the case when the ventilation filter 4 comprises several ventilation openings 6, the ventilation opening or openings 6 being borne by the free end projecting from the rivet blank or rivet blanks 5. The rest of the so-called outer rivet blanks 5a are then positioned on the base plate 1 outside the ventilation filter 4.

In the instance of a ventilation filter 4 having several ventilation openings 6, which is not the most frequent configuration, when at least two rivet blanks 5 are borne by the ventilation filter 4, the rivet blanks 5 have an internal tube 7 bearing a ventilation opening 6 at the free end thereof which projects from the plate 1, the other end thereof being linked to the ventilation device 9, 11 borne by the ventilation filter 4. In this instance, the rivet blanks 5 can be borne by the ventilation filter 4 such as to be off center with respect to the mid-portion of the ventilation filter 4.

An advantageous configuration of the present invention relates to a base plate 1 with a single rivet blank 5 borne by the ventilation filter 4. In this instance, the single rivet blank 5 is arranged in the center of the ventilation filter 4 and connects with the ventilation device 9, 11 which is central to the filter 4.

Another configuration relates to a base plate 1 comprising one or more outer rivet blanks 5a located on the plate 1 outside the ventilation filter 4 and a rivet blank 5 borne by the ventilation filter 4, which blank is advantageously borne by the mid-area of the ventilation filter 4.

In order for the respective internal tube 7 of the rivet blank or blanks 5 to have the ventilation opening 6 at the free end of each rivet blank 5 intended to be opposite the printed circuit 3, each free end can be bored through. The boring can be carried out prior to the riveting or during the riveting as will be described in detail later. The other side of the internal tube 7 opens into the ventilation device 9, 11 internal to the pedestal 8 of the ventilation filter 4 via the base 12 thereof.

Referring more particularly to FIGS. 1-4, the pedestal 8, of rectangular shape, and said at least one rivet blank 5 are formed as a single piece with the base plate 1, therefore in a single unit with the base plate 1. The base plate 1 can be produced by stamping, particularly by successive stamping operations in order to form the various elements present on the base plate 1.

The pedestal 8 can bear a central member 9 arranged in the middle of the pedestal 8, the central member 9 being advantageously circular. The central member 9 and air flow channels, one of which is referenced 11 in FIGS. 3 and 4, form the air flow device of the ventilation filter 4. The air flow channels 11 can start from the central member 9 while being directed towards a respective portion of the contour of the pedestal 8.

In a preferred embodiment, the pedestal 8 can be elevated with respect to the rest of the base plate 1 on the face 1a of the plate 1 through which said at least one rivet blank 5 projects.

Likewise, the central member 9 and the air flow channels 11 forming the ventilation device 9, 11 of the ventilation filter 4 can be elevated with respect to the pedestal 8 on the same face 1a of the plate 1. In this instance, the air flow channels 11 and the central member 9 define a recessed shape in the pedestal 8 on the face 1b of the plate 1 opposite the face 1a through which said at least one rivet blank 5 projects. This is particularly clearly visible in FIG. 4.

The base plate 1 can be produced by stamping an aluminum sheet for example, wherein the various protrusions on the base plate 1 can be produced by successive stamping operations. It is also possible for the base plate 1 to be manufactured by aluminum casting or plastic molding.

An advantageous embodiment of the rivet blank 5 borne by the ventilation filter 4 will now be described in detail. Such an embodiment of a rivet blank 5 can be used for a rivet blank 5a on the base plate 1 outside the ventilation filter 4.

At least one rivet blank 5 borne by the ventilation filter 4 of the base plate 1 can have a cylindrical or conical base 12 connected to the pedestal 8 of the ventilation filter 4. This cylindrical or conical base 12 is extended by a lug 13 which ends by forming a free end of the rivet blank 5 borne by the ventilation filter 4.

It is via the base 12 of said at least one rivet blank 5 that the internal tube 7 opens into the ventilation device 9, 11 of the ventilation filter 4 via an end, the other end thereof which projects furthest from the base plate 1 bearing the ventilation opening 6. It is also on the base 12 that a membrane 15 will be stuck after riveting.

The lug 13 points towards the printed circuit 3 at the start of the riveting method in order to be inserted and then deformed in a hollowing arranged in the printed circuit 3, advantageously then in the planar shape of a board bearing various electronic components.

A method of forming at least one rivet blank 5 borne by a ventilation filter 4 on a base plate 1 as described above will now be described, this method being in accordance with the present invention. In this method, the base 12 and the lug 13 of said at least one rivet blank 5 are formed by at least two successive and respective stamping operations. The first stamping operation forms the conical and cylindrical base 12 while the second stamping operation forms the lug 13.

The ventilation filter 4 can be formed on the base plate 1 by at least three successive stamping operations: a first stamping operation for the simultaneous formation of the central member 9 and of the air flow channels 11 followed by a second and a third stamping operation for the respective formation of the base 12 and then of the lug 13 of said at least one rivet blank 5. A prior stamping operation to form the pedestal 8 of the ventilation filter 4 can also be implemented.

With regard to FIGS. 5 and 6 in association with FIGS. 3 and 4, two embodiments of the method for riveting a printed circuit on a base plate 1 using at least one rivet blank 5 borne by a ventilation filter 4 will now be described. The rivet blank or blanks 5 borne by the ventilation filter 4, advantageously a single blank, are obtained in accordance with the formation method as described above with formation of a base and of a lug 13 for the blank 5 or each blank. This has been shown in FIGS. 3 and 4.

During the riveting, the free end of the lug 13 of said at least one rivet blank 5 is flattened and widened, transforming it into a rivet. The flattening and the widening of the free end of the lug 13 is carried out on the other face of the printed circuit 3 rather than the face orientated towards the base plate 1, the free end of the lug 13 widened in this manner forming an obstacle to the withdrawal of the rivet formed in this manner from the printed circuit 3.

In the two embodiments shown in FIGS. 5 and 6, the flattening and the widening of the free end of the lug 13 are obtained via pressure exerted from the outside towards the base plate 1 on the free end of the lug 13 against an anvil tool 14 inserted through the internal tube 7 into the lug 13 by starting from the base 12 thereof.

A tool which is outside the rivet blank 5, called a compression tool 21, presses from the outside on the free end of the lug 13 and crushes it against the anvil tool 14 inside the rivet blank 5. The compression tool 21 can have various profiles, for example a concave profile, a convex profile, an enveloping profile or a flat profile. A flat profile for the compression tool 21 is preferred.

As can be seen in FIGS. 5 and 6, the length of the anvil tool 14 which has penetrated the rivet blank 5 via the tube 7 is determined in order to correspond to the desired spacing between the base plate 1 and the printed circuit 3 by taking into account the thickness of these two elements.

At the start of crushing the rivet blank 5, the free end is pushed back towards the anvil tool 14 by the outer compression tool 21. The continuation of the movement of the compression tool 21 towards the base plate 1 causes the flattening and the widening of the free end of the rivet blank 5 pinched between the two tools 14, 21.

According to features of the invention, the free end of the lug 13 is bored through, advantageously from the inside of the lug 13, prior to or at the same time as the crushing. This allows the internal tube 7 of the rivet blank 5 to open at the free end of the blank 5 by forming the ventilation opening 6 of the ventilation filter 4.

This can be achieved using a drilling head independent of the anvil tool 14 which penetrates the boring forming the ventilation opening 6 of the rivet blank 5, in this instance prior to the crushing of the free end of the lug 13. Therefore, it is possible to have a base plate 1 with at least one rivet blank 5 passing via the ventilation internal tube 7 for the ventilation filter 4, this rivet blank 5 being already bored through before riveting as shown in FIGS. 3 and 4.

In FIGS. 5 and 6, the boring is carried out at the same time as the riveting therefore at the crushing of the free end of the rivet blank 5. In FIG. 5, the printed circuit at least partially surrounding the rivet blank 5 is not shown but a portion of the rivet blank 5 passes through this printed circuit before riveting.

In the embodiment shown in FIG. 5, this can be achieved by the anvil tool 14, the face of this tool 14 opposite the free end bearing a boring tip 14a. This boring tip 14a passes right through the free end of the rivet blank 5 and can be inserted into a housing 22 provided on the opposite face of the compression tool 21 moving from the outside towards the free end of the rivet blank 5 in the direction of the arrow in FIG. 5.

This housing 22 is optional, wherein the boring can be achieved by a forward movement of the anvil tool 14 inside the rivet blank 5 followed by a withdrawal such that the boring tip 14a is not damaged by the pressure of the compression tool 21.

In the embodiment shown in FIG. 6, the compression tool 21 has a bush 23 penetrating a hole previously bored in the free end of the rivet blank 5. During the deformation of the rivet blank 5 via crushing, the boring tip 14a of the anvil tool 14 penetrates inside the bush 23 and completes the boring, the bush 23 ensuring that the boring hole does not close over during crushing and protecting the boring tip 14a from the crushing.

After riveting and withdrawal of the anvil tool 14 from the rivet formed in this manner, still according to the invention, a membrane 15 is positioned on the base 12 of the rivet, this membrane 15 being shown in FIG. 7 spaced from the ventilation filter 4 and from the protective case 2 in order to be more visible. The membrane 15 then covers the rivet on the face 1b of the base plate 1 opposite the face 1a from where said at least one rivet projects.

FIG. 7 shows an assembly of a printed circuit 3 and of the protective case 2 thereof, wherein this protective case 2 can be in accordance with the present invention when the ventilation filter 4 bears at least one rivet blank 5 which has become a rivet by rigidly connecting the printed circuit 3 to the base plate 1.

The protective case 2 comprises a hollow housing 19 and a base plate 1. The hollow case 19 receives the printed circuit 3 in the interior thereof, the printed circuit 3 been rigidly connected to the base plate 1 of the case 2 by at least one rivet.

A wall of the protective case 2 has a cutout receiving a connector 16 electrically linked to the printed circuit 3. The base plate 1 of the assembly is as previously described with at least one rivet passing through the ventilation filter 4 of the base plate 1.

A membrane 15 covers the base 12 of the rivet of the ventilation filter 4 and said at least one rivet borne by the ventilation filter 4 on the face 1b opposite the face from where said at least one rivet projects. This membrane 15 is a breathable membrane as it allows the passage of air in order to provide the function of the ventilation filter 4. This membrane 15 can be stuck at the center of the ventilation filter 4 on the base of the rivet.

The printed circuit 3, in the form of a board bearing electronic components on a first face, has a second face opposite the first face applied against or held at a small distance from the base plate 1. During the riveting, said at least one rivet borne by the ventilation filter 4 has penetrated the printed circuit 3 via a portion of the board which is free of any electrical component on the first face thereof.

Referring in particular to FIGS. 1 and 7, a portion 18 of the base plate 1, previously mentioned as a thermal platform 18, can be covered locally with a thermal interface material inserted between the plate 1 and the printed circuit 3 inserted between the base plate 1 and the contour of the printed circuit 3 second face applied against or held at a small distance from the base plate 1.

At least one rivet can be positioned on the base plate 1 outside the ventilation filter 4, which is not always the case within the scope of the invention and is in addition to the rivet borne by the ventilation filter 4 which is an essential feature of the present invention.

The rivet or rivets outside the ventilation filter 4 can be located, as previously mentioned with respect to FIG. 1, on the platform 18 covered locally with the thermal interface material inserted between the plate 1 and the printed circuit 3. The first face of the printed circuit 3, advantageously in the form of a board, opposite the base plate 1, cannot bear electronic components on portions of the first face corresponding to portions of the second face opposite the base plate 1 and which are covered with the thermal interface material inserted between the plate 1 and the printed circuit 3. It is therefore possible for the rivets to pass through the base plate 1 on these portions.

The ventilation filter 4 can comprise a protective member 20 entirely covering the pedestal 8 of the filter 4 on a face 1b of the plate 1 opposite the face 1a through which said at least one rivet blank 5 projects. This protective member 20 is advantageously in the form of a label.

The case 2 can also have, on an outer face opposite that formed by the base plate 1, an element which has a pedestal with a central member and air flow channels 11 similar to the pedestal 8 of the ventilation filter 4, this element not being invisible in the figures. This element of the case 2 can also be covered with a protective member, also not visible in the figures, advantageously in the form of a label and is for the attention of the user of the case 2.

As another additional feature, the case 2 can have a sealing member between the housing thereof and the face of the connector 16 opposite the housing, this connector 16 being electrically linked to the printed circuit 3. The sealing element extends between the housing and the base plate 1 while resting against the base plate 1.

The edge of the connector 16 orientated towards the base plate 1 can have a sealing bar between the connector 16 and the base plate 1.

The present invention can be used for all of the electronic cases 2 provided with a ventilation filter 4 and with a base plate 1 including at least one rivet blank 5 intended to become a rivet for holding a printed circuit 3 with respect to the base plate 1. This protective case 2 and printed circuit 3 assembly can form a computer, advantageously, but not limited to, a computer on board a motor vehicle.

The invention claimed is:

1. A base plate for a protective case of a printed circuit, the plate comprising:
   a ventilation filter including at least one ventilation opening; and
   at least one rivet blank projecting from the plate, said at least one rivet blank penetrating the printed circuit and configured to be deformed for rigidly connecting the printed circuit to the base plate by projecting from a face of the plate, said at least one rivet blank being borne by the ventilation filter and including an internal tube passing right through said at least one rivet blank in the projecting direction thereof, the internal tube opening, on one side, onto an end of said at least one rivet blank projecting furthest from the plate while forming the ventilation opening, and, on the other side, into the ventilation filter.

2. The base plate according to claim 1, wherein the internal tube opens into a ventilation device internal to a pedestal of the ventilation filter, the ventilation device comprising air flow channels.

3. The base plate according to claim 2, wherein the pedestal and said at least one rivet blank are formed as a single piece with the base plate, the pedestal being rectangular and bearing at the middle thereof a central member which is part of the ventilation device, the air flow channels starting from the central member while being directed towards a respective portion of the contour of the pedestal, the pedestal being elevated with respect to the rest of the base plate on the face of the plate through which said at least one rivet blank projects, the central member and the air flow channels being elevated with respect to the pedestal on the face of the plate, the air flow channels and the central member forming the ventilation device defining a recessed shape in the pedestal on another face of the plate opposite the face through which said at least one rivet blank projects.

4. The base plate according to claim 1, wherein the base plate comprises at least two rivet blanks, at least one other rivet blank of the at least two rivet blanks other than said at least one rivet blank borne by the ventilation filter being one of (i) borne by the ventilation filter, and (ii) positioned on the base plate outside the ventilation filter, the remaining rivet blanks of the at least one other rivet blank being positioned on the base plate outside the ventilation filter.

5. The base plate according to claim 1, wherein said at least one rivet blank has a cylindrical or conical base extended by a lug which ends by forming a free end of said at least one rivet blank.

6. A method of forming the at least one rivet blank borne by the ventilation filter on the base plate according to claim 5, comprising:
  forming the and the lug of said at least one rivet blank by at least two successive and respective stamping operations.

7. The method according to claim 6, further comprising:
  forming the ventilation filter on the base plate by at least three successive stamping operations:
  a first stamping operation for the simultaneous formation of the central member and of the air flow channels followed by a second stamping operation and a third stamping operation for the respective formation of the base and then of the lug of said at least one rivet blank.

8. A method of riveting the printed circuit on the base plate using the at least one rivet blank borne by the ventilation filter, said at least one rivet blank being obtained in accordance with the formation method according to claim 6, the riveting method comprising:
  flattening and widening the free end of the lug of said at least one rivet blank, transforming the free end of the lug into a rivet by pressure exerted from the outside towards the base plate on the free end of the lug against an anvil tool inserted via the internal tube into the lug starting from the base, the free end of the lug being bored through prior to or at the same time as the crushing; and
  after riveting, positioning a membrane covering said at least one rivet on the other face opposite the face of the base plate from where said at least one rivet projects.

9. An assembly comprising:
  the printed circuit; and
  the protective case protecting the printed circuit, the protective case comprising
    a hollow housing receiving the printed circuit in an interior thereof, and
    the base plate according to claim 1,
  wherein the printed circuit is rigidly connected to the base plate of the protective case by at least one rivet, a wall of the protective case having a cutout receiving a connector electrically linked to the printed circuit, said at least one rivet blank borne by the ventilation filter having been transformed into at least one rivet, a membrane covering said at least one rivet on an other face opposite the face from where said at least one rivet projects, and
  the printed circuit is in the form of a board bearing electronic components on a first face and has a second face, opposite the first face, applied against or held at a small distance from the base plate, said at least one rivet borne by the ventilation filter penetrating the printed circuit via a portion of the board free of any electronic component on the first face thereof.

10. The assembly according to claim 9, wherein a portion of the base plate is covered locally with a thermal interface material inserted between the base plate and a contour of the second face of the printed circuit, and when at least one rivet is positioned on the base plate outside the ventilation filter, the at least one rivet is located on a respective area of the portion of the base plate covered locally with the thermal interface material.

11. The base plate according to claim 2, wherein the base plate comprises at least two rivet blanks, at least one other rivet blank of the at least two rivet blanks other than said at least one rivet blank borne by the ventilation filter being one of (i) borne by the ventilation filter, and (ii) positioned on the base plate outside the ventilation filter, the remaining rivet blanks of the at least one other rivet blank being positioned on the base plate outside the ventilation filter.

12. The base plate according to claim 3, wherein the base plate comprises at least two rivet blanks, at least one other rivet blank of the at least two rivet blanks other than said at least one rivet blank borne by the ventilation filter being one of (i) borne by the ventilation filter, and (ii) positioned on the base plate outside the ventilation filter, the remaining rivet blanks of the at least one other rivet blank being positioned on the base plate outside the ventilation filter.

13. The base plate according to claim 2, wherein said at least one rivet blank has a cylindrical or conical base extended by a lug which ends by forming a free end of said at least one rivet blank.

14. The base plate according to claim 3, wherein said at least one rivet blank has a cylindrical or conical base extended by a lug which ends by forming a free end of said at least one rivet blank.

15. The base plate according to claim 4, wherein said at least one rivet blank has a cylindrical or conical base extended by a lug which ends by forming a free end of said at least one rivet blank.

16. A method of riveting the printed circuit on the base plate using the at least one rivet blank borne by the ventilation filter, said at least one rivet blank being obtained in accordance with the formation method according to claim 7, the riveting method comprising:
  flattening and widening the free end of the lug of said at least one rivet blank, transforming the free end of the lug into a rivet by pressure exerted from the outside towards the base plate on the free end of the lug against an anvil tool inserted via the internal tube into the lug starting from the base, the free end of the lug being bored through prior to or at the same time as the crushing; and
  after riveting, positioning a membrane covering said at least one rivet on the other face opposite the face of the base plate from where said at least one rivet projects.

17. An assembly comprising:
  the printed circuit; and
  the protective case protecting the printed circuit, the protective case comprising
    a hollow housing receiving the printed circuit in an interior thereof, and
    the base plate according to claim 2,
  wherein the printed circuit is rigidly connected to the base plate of the protective case by at least one rivet, a wall of the protective case having a cutout receiving a connector electrically linked to the printed circuit, said at least one rivet blank borne by the ventilation filter having been transformed into at least one rivet, a membrane covering said at least one rivet on an other face opposite the face from where said at least one rivet projects, and
  the printed circuit is in the form of a board bearing electronic components on a first face and has a second face, opposite the first face, applied against or held at a small distance from the base plate, said at least one rivet borne by the ventilation filter penetrating the printed circuit via a portion of the board free of any electronic component on the first face thereof.

18. An assembly comprising:
  the printed circuit; and
  the protective case protecting the printed circuit, the protective case comprising
    a hollow housing receiving the printed circuit in an interior thereof, and the base plate according to claim 3,
wherein the printed circuit is rigidly connected to the base plate of the protective case by at least one rivet, a wall of the protective case having a cutout receiving a connector electrically linked to the printed circuit, said at least one rivet blank borne by the ventilation filter having been transformed into at least one rivet, a membrane covering said at least one rivet on an other face opposite the face from where said at least one rivet projects, and the printed circuit is in the form of a board bearing electronic components on a first face and has a second face, opposite the first face, applied against or held at a small distance from the base plate, said at least one rivet borne by the ventilation filter penetrating the printed circuit via a portion of the board free of any electronic component on the first face thereof.

19. An assembly comprising:

the printed circuit; and the protective case protecting the printed circuit, the protective case comprising a hollow housing receiving the printed circuit in an interior thereof, and the base plate according to claim 4,
wherein the printed circuit is rigidly connected to the base plate of the protective case by at least one rivet, a wall of the protective case having a cutout receiving a connector electrically linked to the printed circuit, said at least one rivet blank borne by the ventilation filter having been transformed into at least one rivet, a membrane covering said at least one rivet on an other face opposite the face from where said at least one rivet projects, and the printed circuit is in the form of a board bearing electronic components on a first face and has a second face, opposite the first face, applied against or held at a small distance from the base plate, said at least one rivet borne by the ventilation filter penetrating the printed circuit via a portion of the board free of any electronic component on the first face thereof.

20. The base plate according to claim 10, wherein said at least one rivet blank has a cylindrical or conical base extended by a lug which ends by forming a free end of said at least one rivet blank.

\* \* \* \* \*